United States Patent [19]
Altstatt

[11] 4,293,956
[45] Oct. 6, 1981

[54] DOUBLE-BALANCED MIXER
[75] Inventor: John E. Altstatt, Palo Alto, Calif.
[73] Assignee: California Microwave, Inc., Sunnyvale, Calif.
[21] Appl. No.: 96,845
[22] Filed: Nov. 23, 1979
[51] Int. Cl.³ .......................... H04B 1/26; H03H 7/42
[52] U.S. Cl. ....................................... 455/327; 333/26
[58] Field of Search ............................... 455/325–328; 333/25, 26; 363/157–159

[56] References Cited
U.S. PATENT DOCUMENTS 3,772,599 11/1973 Ernst et al. ........................ 455/327
4,063,176 12/1977 Milligan et al. ...................... 455/326
4,125,810 11/1978 Pavio ................................... 455/325

Primary Examiner—Jin F. Ng
Attorney, Agent, or Firm—Claude A. S. Hamrick

[57] ABSTRACT

A double-balanced mixer device including a planar substrate selectively plated on both sides to form certain mixer component parts and including a pair of quarter wavelength narrow strips extending from the component parts which form one of the balanced lines, such strips having their distal ends shorted together to provide an output terminal at which an IF signal may be taken. The quarter wavelength strips provide a low impedance path for IF signals but effectively block RF signals.

6 Claims, 5 Drawing Figures

DOUBLE-BALANCED MIXER

BACKGROUND OF THE INVENTION

1. Field of the Invention

The present invention relates generally to electronic mixers and more specifically to doublebalanced electronic mixers fabricated using printed circuit and thin film technology.

2. Description of the Prior Art

A detailed description of state-of-the-art mixers is given in "RF Signal Processing Component", Watkins-Johnson Company, 1978, pp. 374–394, and such description is incorporated herein by reference. As pointed out in such reference, the manufacture of double-balanced mixers using thin film technology is well known. However, heretofore, in order to obtain the IF output signal without disrupting the balance between the LO input signal circuit and the RF input signal circuit, it was necessary to use fine wires, ferrite beads or other mechanical techniques. Such practices are far less than ideal and often require delicate "hand tweeking" by a highly skilled technician in order to make the device operational.

Another disadvantage of prior art devices is that they are fabricated using at least two printed circuit "cards." This, of course, means that the cost of the device is higher than would be the case for a single card embodiment.

SUMMARY OF THE INVENTION

It is therefore an objective of the present invention to provide a single card, printed circuit mixer device for use at microwave frequencies.

Another objective of the present invention is to provide a single card, double-balanced mixer device having improved means for extracting the IF signal without interfering with the operation of the device.

Briefly, a preferred embodiment of the present invention includes a substrate selectively plated on both sides to form printed circuit elements comprising certain component parts of a double-balanced mixer, such elements including a pair of quarter wavelength narrow strips extending from the components forming one of the balanced lines and having their distal ends shorted together to provide an output terminal at which the IF signal can be taken without disturbing the device operation.

An important advantage of the present invention is that the exception of the necessary discrete diode and capacitor components which must be added, all other circuit elements are made by photoligraphically etching conductive layers deposited on the two sides of a single dielectric substrate, thereby providing a topologically accurate yet inexpensive device which requires no hand tweeking.

Another advantage of the present invention is that is provides an inexpensive microwave mixer device which can be easily assembled by ordinary assembly personnel.

These and other objects of the present invention will no doubt become apparent to those of ordinary skill in the art after they have read the following detailed description of a preferred embodiment which is illustrated in several figures of the drawing.

IN THE DRAWING

DESCRIPTION OF THE PREFERRED EMBODIMENT

Figure 1:
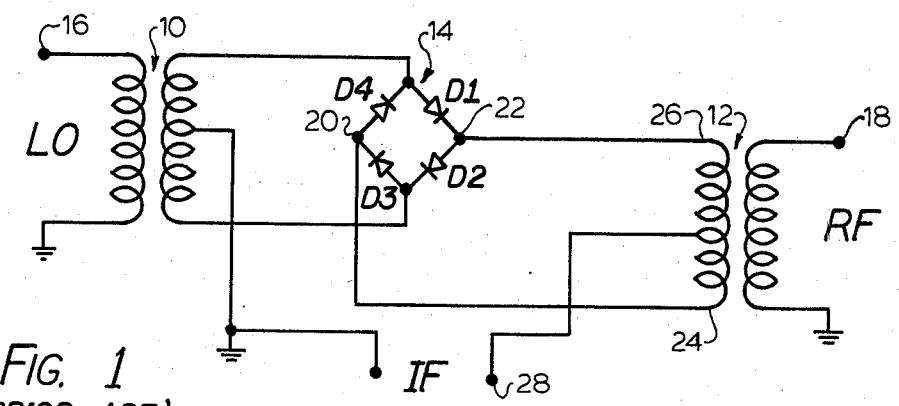
FIG. 1 is a schematic diagram illustrating a prior art double-balanced mixer circuit.

For purposes of reference, a typical doublebalanced, four-diode ring mixer circuit is illustrated in FIG. 1 and includes a pair of input transformers 10 and 12, four-diode ring circuit 14 and means forming input ports 16 and 18 for receiving local oscillator (LO) and radio frequency (RF) signals respectively. The basic operational concept upon which mixing depends is that the application of a radio frequency input (RF) and a local oscillator input (LO) to the mixer device results in an intermediate frequency (IF) output which is equal to the difference between the two input signals.

More specifically, the voltage developed at the secondary of the LO transformer 10 causes current to flow through either the diode pair D1 and D2 or the pair D3 and D4, depending upon polarity. The DC voltages developed at the diode terminals 20 or 22 is held at virtual ground potential by the voltage divider action of the conducting diode pair. The diode pairs alternate conduction and thus cause the ends 24 and 26 of the secondary of RF transformer 12 to be alternatively at ground potential, switching at a rate equal to the frequency of the input signal applied to the LO port 16.

The instantaneous voltage at the IF port 28 is determined by (a) the level and polarity of the instantaneous voltage at the RF transformer secondary winding and (b) by which terminal of the secondary is at ground potential at any particular instance. The output at the IF port 28 contains the sum and difference of the frequencies of the signals input to the LO and RF ports. However, by appropriately timing the output circuit the difference frequency IF can be selectively filtered to appear at the IF port.

Figure 2:
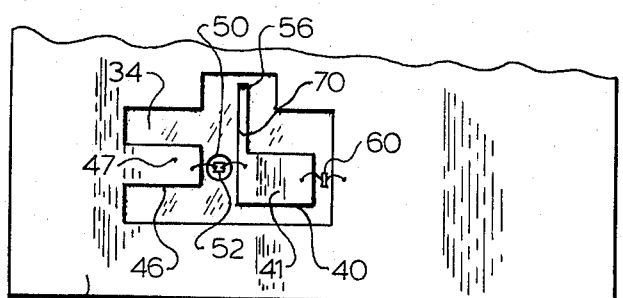
FIG. 2 is a plan view showing one side of a double-balanced mixer device in accordance with the present invention.
Figure 4:
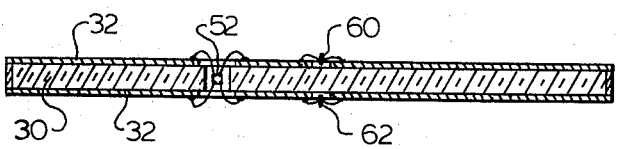
FIG. 4 is a cross section taken along the lines 4—4 of FIGS. 2 and 3.
Figure 3:
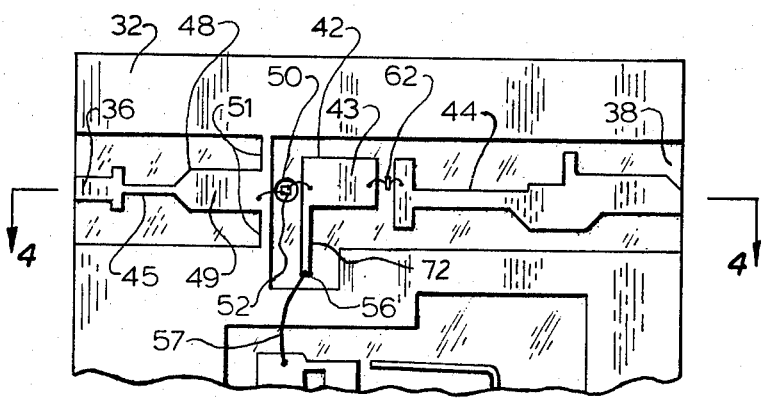
FIG. 3 is a plan view showing the opposite side of the device ilustrated in FIG. 2.

Referring now to FIGS. 2, 3 and 4, a single "card" implementation of the circuit of FIG. 1 in accordance with the present invention and operational at microwave frequencies is illustrated. This embodiment is made by plating both sides of a dielectric substrate 30 with a suitable conductive film 32 and then photolithographically etching away the area 34 on one side and the areas 36 and 38 on the other side leaving isolated conductive bodies 40, 42, and 44. Other conductive bodies 46 and 48 are also defined but remain joined to the plated layers which form the circuit ground plane. An opening 50 is provided in the substrate 30 for receiving a diode ring device 52 having four terminals that are respectively connected by means of fine wires to the facing extremities of the elongated bodies 40 and 46 and 42 and 48 respectively. Note also that prior to the plating operation, an opening was provided in substrate 30 at 56 and was plated through so as to result in the electrical connection of the bodies 40 and 42.

The rectangular portions 47 and 49 of bodies 46 and 48, respectively, form a balanced line (balun) which is equivalent at microwave frequencies to the LO transformer 10 of FIG. 1. The larger rectangular portions 41 and 43 of conductive bodies 40 and 42, respectively, form a balanced line which is equivalent at microwave frequencies to the RF transformer 12. The remaining portion 45 of conductive body 48 forms a LO input terminal (or port) and matching structure while the body 44 forms a similar RF terminal (or port) and matching structure. Note that the rightmost depicted end of body 48 is connected to the ground plane by means of narrow strips 51 which provide ground return conductors for the IF signal. Note also that body 40 is coupled to ground plane 32 by a capacitor 60 and that body 42 is coupled to the RF input structure 44 by a capacitor 62. These capacitors are capable of passing the RF signal while blocking the IF signal.

An important feature of the present invention is the provison of the two narrow strips 70 and 72 which extend from the larger portions of body 40 and 42, respectively, and are connected at 56. In order to get the IF signal out from the balanced line formed by bodies 40 and 42, the two bodies must be connected together. However, a simple direct connection therebetween would short out the RF energy and make the device inoperative. Moreover, the connection must also allow the extraction of the IF signal without materially affecting the RF signal. The strips 70 and 72 permit such end to be accomplished.

Figure 5:
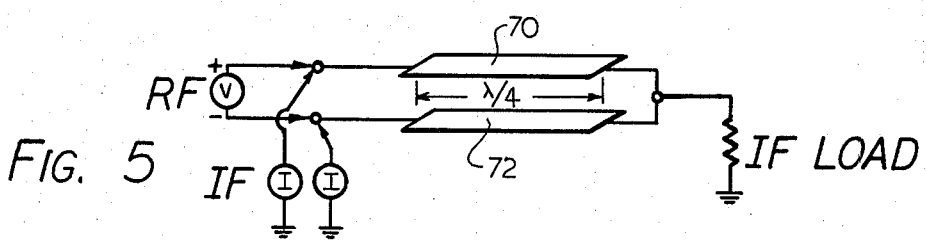
FIG. 5 is a diagram used to illustrate operation of the present invention.

The length of strips 70 and 72 is selected to be approximately equal to one quarter of the wavelength of the IF signal. As a result, the strips will have a low impedance at the IF frequency because their electrical length is small and the voltage on each strip has the same polarity. The latter point can be appreciated by noting that, as illustrated in FIG. 5, the diode bridge appears as two in-phase generators of IF current with respect to ground. Since the current through the strips is in phase there is no voltage difference across them and the strips appear to the If signal as merely a short length of transmission line. Consequently, the series impedance is low and the IF current readily flows to the load.

On the other hand however, the RF voltages applied to the two strips 70 and 72 are out of phase and the strips look like a quarter wave stub having a high impedance at the RF frequency. As a result RF current does not flow to the IF load. Such structure thus permits the body 40 to be electrically tied to the body 42 and simultaneously provides an IF terminal at 56 which is equivalent to the terminal 28 of the FIG. 1 circuit.

Terminal 56 can be connected in any suitable fashion to other circuitry. For example, where other circuitry is fabricated on the same card, terminal 56 can either be connected to the input terminal of the other circuitry by a fine wire as illustrated at 57 or can be directly connected thereto photolithographically during manufacture of the card.

Although the present invention has been described above in terms of a particular mixer embodiment, it will be appreciated that other device configurations could likewise be utilized so long as the narrow, quarter wavelength strips are used in accordance with the present invention as a means of providing the necessary IF output terminal. It is therefore intended that the appended claims be interpreted as covering all such other embodiments that fall within the true spirit and scope of the invention.

What is claimed is:

1. A double-balanced mixer device comprising:
   a dielectric substrate having opposite first and second surfaces, said first surface having a first region defined by one or more other regions that are coated with a conductive material to form a first ground plane, said second surface having a second region defined by one or more second other regions that are likewise coated with a conductive material to form a second ground plane that is electrically connected to said first ground plane;
   first elongated conductor means disposed on said first surface within said first region and having a first extremity electrically connected to said first ground plane, and having a second extremity;
   second conductor means disposed on said first surface within said first region and including
      a first elongated portion with a third extremity disposed in spaced-apart relationship to an edge of said first ground plane and a fourth extremity disposed in spaced-apart relationship to said second extremity, and
      a second elongated portion forming a first narrow strip having a length equal to one-quarter of the wavelength of an IF output signal and extending laterally relative to said portion and terminating in a fifth extremity;
   third conductor means disposed on said second surface within said second region and overlying said first conductor means to form a first balanced line for receiving a LO input signal at a sixth extremity thereof and having a seventh extremity electrically connected to said second ground plane to provide an output signal return path;
   fourth conductor means disposed on said second surface within said second region and overlying said second conductor means to form a second balanced line for receiving an RF input signal, said fourth conductor means including
      a third elongated portion having an eight extremity disposed in spaced-apart relationship to said seventh extremity, and a ninth extremity, and
      a fourth elongated portion forming a second narrow strip having a length equal to one-quarter of the wavelength of said IF output signal and extending laterally relative to said third elongated portion and in overlying relationship with said second elongated portion, said second strip having a tenth extremity electrically connected to said fifth extremity and providing an output terminal for said device; and
   diode bridge means having first, second, third, and fourth terminals, said first terminal being connected to said second extremity, said second terminal being connected to said seventh extremity, said third terminal being connected to said third extremity and said fourth terminal being connected to said eighth extremity.

2. A double-balanced mixer device as recited in claim 1 and further comprising:
   a fifth conductor means disposed on said second surface within said second region and having an eleventh extremity for receiving said RF input signal, and a twelfth extremity disposed in spacedapart relationship to said ninth extremity; and capacitive means coupling said ninth extremity to said twelfth extremity and said fourth extremity to said first ground plane.

3. In a double-balanced mixer device including first conductive means disposed upon surfaces of a dielectric substrate and forming a first balun for receiving an input LO signal, second conductive means likewise disposed upon surfaces of said substrate and forming a second balun for receiving an input RF signal, diode means coupling said first balun to said second balun, and output means coupled to said first balun and said second balun to form an output port for IF signals, and improved second balun and output means comprising:

a first body of conductive material having first and second portions disposed on one side of said substrate, said second portion being elongated and narrow relative to said first portion and having a length equal to one quarter of the wavelength of said IF signal; and a second body of conductive material having third and fourth portions disposed on an opposite side of said substrate in overlying relationship to said first and second portions, said fourth portion being elongated and narrow relative to said third portion and having a length equal to one quarter of the wavelength of said IF signal, the distal ends of said second and fourth portions being connected together to form a terminal of said output port.

4. In a double-balanced mixer device as recited in claim 3 wherein said first and third portions are in plan view elongated rectangles, and wherein said second and fourth portions are in plan view elongated narrow strips which extend laterally away from the longitudinal axes of said elongated rectangles.

5. In a double-balanced mixer device as recited in claim 3 wherein said distal ends lie over an opening in said substrate and are connected together during the deposition of the printed circuits upon the surfaces of said substrate.

6. In a double-balanced mixer device as recited in claims 3 or 4 wherein the width-to-separation ratio of said second and fourth portions is selected to provide a high impedance to said RF signal but a relatively low impedance to said IF signal.

* * * * *